US011329619B2

(12) United States Patent
Nomura et al.

(10) Patent No.: US 11,329,619 B2
(45) Date of Patent: May 10, 2022

(54) OPERATIONAL AMPLIFIER

(71) Applicant: ROHM Co., LTD., Kyoto (JP)

(72) Inventors: Naohiro Nomura, Kyoto (JP); Takatoshi Manabe, Kyoto (JP)

(73) Assignee: ROHM Co., LTD., Kyoto (JP)

( * ) Notice: Subject to any disclaimer, the term of this patent is extended or adjusted under 35 U.S.C. 154(b) by 0 days.

(21) Appl. No.: 17/177,441

(22) Filed: Feb. 17, 2021

(65) Prior Publication Data
US 2021/0265962 A1 Aug. 26, 2021

(30) Foreign Application Priority Data

Feb. 21, 2020 (JP) .............................. JP2020-028195

(51) Int. Cl.
*H03F 3/45* (2006.01)
*H03F 3/72* (2006.01)

(52) U.S. Cl.
CPC ..... *H03F 3/45753* (2013.01); *H03F 3/45233* (2013.01); *H03F 3/45273* (2013.01); *H03F 3/72* (2013.01); *H03F 3/45183* (2013.01); *H03F 3/45659* (2013.01); *H03F 2203/7227* (2013.01)

(58) Field of Classification Search
CPC ............. H03F 3/45753; H03F 3/45233; H03F 3/45273; H03F 3/72; H03F 2203/7227; H03F 3/45219; H03F 3/45; H03F 3/45179; H03F 3/45183; H03F 3/45188; H03F 3/45192
USPC .................................................. 330/253, 258
See application file for complete search history.

(56) References Cited

U.S. PATENT DOCUMENTS 9,742,397 B2 * 8/2017 Yuan ................... H03F 3/45726
2019/0036500 A1 * 1/2019 Nomura .......... H01L 21/823412

FOREIGN PATENT DOCUMENTS

JP 2010222965 10/2010

* cited by examiner

*Primary Examiner* — Khanh V Nguyen
(74) *Attorney, Agent, or Firm* — Chip Law Group

(57) ABSTRACT

Disclosed herein is an operational amplifier including a non-inverting input terminal, an inverting input terminal, a P-type metal oxide semiconductor input differential pair, a first input tail current source, an N-type metal oxide semiconductor input differential pair, a second input tail current source, an output stage, a first correction circuit, and a second correction circuit. The first correction circuit and the second correction circuit operate over an operation region of the P-type metal oxide semiconductor input differential pair, an operation region of the N-type metal oxide semiconductor input differential pair, and a transition region in which both the P-type metal oxide semiconductor input differential pair and the N-type metal oxide semiconductor input differential pair operate.

9 Claims, 14 Drawing Sheets

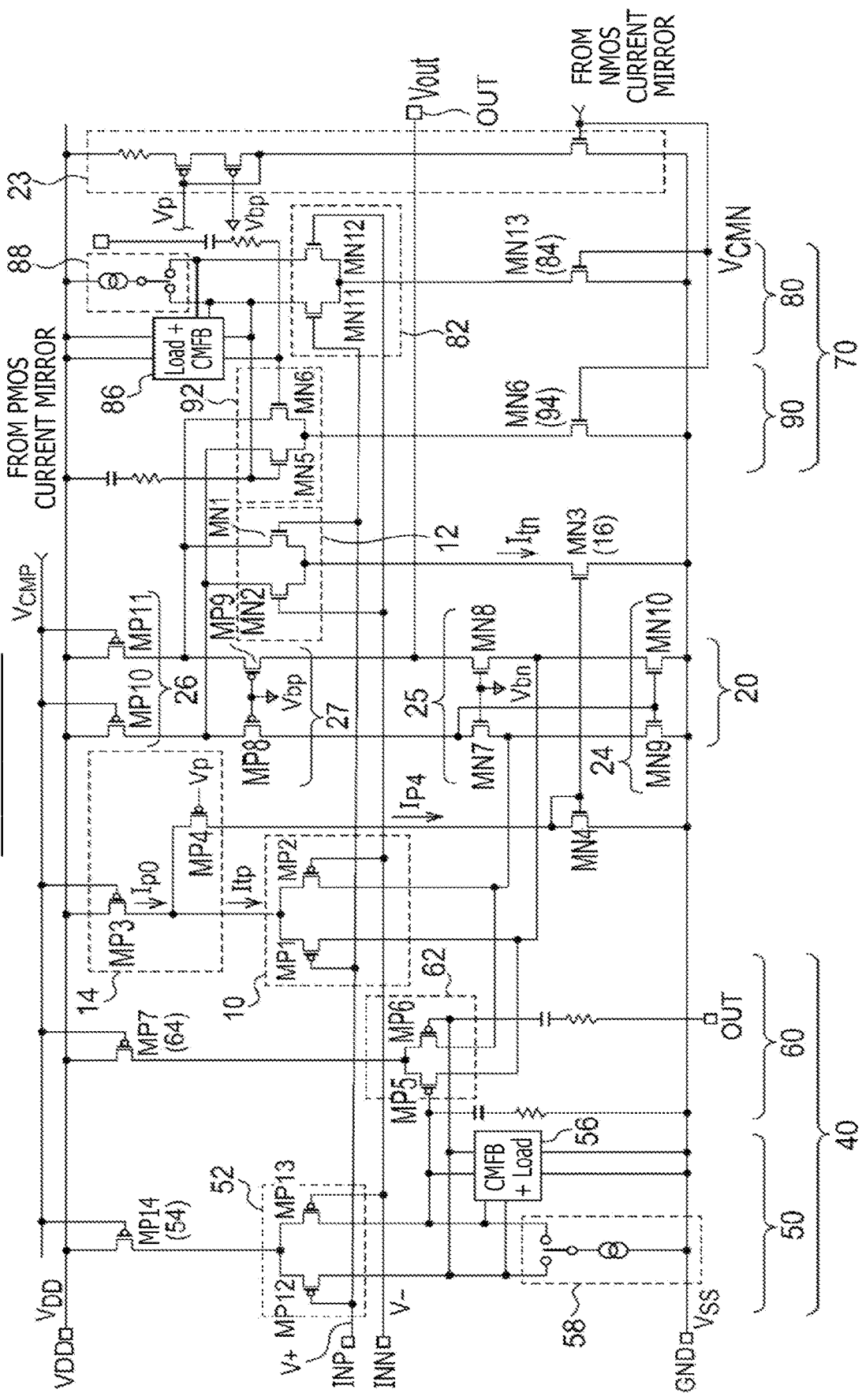

OPERATIONAL AMPLIFIER

CROSS REFERENCE TO RELATED APPLICATIONS

This application claims priority benefit of Japanese Patent Application No. JP 2020-028195 filed in the Japan Patent Office on Feb. 21, 2021. Each of the above-referenced applications is hereby incorporated herein by reference in its entirety.

BACKGROUND

The present disclosure relates to an operational amplifier (differential amplifier).

In recent years, power supply voltages supplied to operational amplifiers have been decreasing since there is a demand for power consumption reduction in electronic devices. Low-voltage applications require Rail-To-Rail operation in order to expand input voltage ranges of the operational amplifiers.

FIG. 1 is a circuit diagram of a Rail-To-Rail folded cascode operational amplifier 1R. The operational amplifier 1R amplifies the difference between two voltages input into differential input terminals INP and INN and outputs the amplified voltage from an output terminal OUT. The operational amplifier 1R mainly includes a P-type metal oxide semiconductor (PMOS) input differential pair 10, an N-type metal oxide semiconductor (NMOS) input differential pair 12, a first input tail current source 14, a second input tail current source 16, an output stage 20, and a switching circuit 30.

The PMOS input differential pair 10 includes a first transistor M1 and a second transistor M2, which are PMOS transistors. The first input tail current source 14 includes an appropriately biased PMOS transistor and supplies a tail current Itp to the PMOS input differential pair 10.

The NMOS input differential pair 12 includes a third transistor M3 and a fourth transistor M4, which are NMOS transistors. The second input tail current source 16 supplies a tail current Itn to the NMOS input differential pair 12.

The output stage 20 converts a differential current flowing through the PMOS input differential pair 10 and a differential current flowing through the NMOS input differential pair 12 into an output voltage Vout. The output stage 20 includes a lower-side circuit 21, an upper-side circuit 22, and a bias circuit 23.

The lower-side circuit 21 includes a constant current circuit 24 (M5 and M6) and a gate-grounded circuit 25. The constant current circuit 24 mirrors the differential current of the PMOS input differential pair 10. The gate-grounded circuit 25 is disposed on a path of the mirrored differential current and includes a pair of NMOS transistors M7 and M8 with their gates biased. The upper-side circuit 22 includes a constant current circuit 26 (M9 and M10) and a gate-grounded circuit 27. The constant current circuit 26 mirrors the differential current of the NMOS input differential pair 12. The gate-grounded circuit 27 is disposed on a path of the mirrored differential current and includes a pair of PMOS transistors M11 and M12 with their gates biased.

The switching circuit 30 switches the PMOS input differential pair 10 and the NMOS input differential pair 12 according to common-mode components (common-mode input voltage VCM) of input voltages $V_+$ and $V_-$. The switching circuit 30 includes a transistor M21, which is a PMOS transistor. A source of the transistor M21 is commonly connected to sources of the first transistor M1 and the second transistor M2. A bias voltage Vb is supplied to a gate of the transistor M21 by the output stage 20.

Of voltages Vgs1 and Vgs2, a higher voltage is denoted as Vgs. When the common-mode input voltage VCM is sufficiently lower than the bias voltage Vb (Vgs21<Vgs), all the tail currents Itp generated by the first input tail current source 14 flow on the PMOS input differential pair 10 side (I1_1=Itp), while no current flows through the transistor M21 (I1_2=0).

When the common-mode input voltage VCM increases to approximately the bias voltage Vb, in other words, when Vgs21≈Vgs, the current I1_2 starts flowing through the transistor M21. Together with transistors M24 and M25 of the second input tail current source 16, transistors M22 and M23 of the switching circuit 30 form a current mirror. The current I1_2 is copied and supplied to the NMOS input differential pair 12 as the tail current Itn. As the common-mode input voltage VCM comes close to a supply voltage VDD, in other words, as Vgs becomes lower than Vgs21, the tail current I1_1 supplied to the PMOS input differential pair 10 decreases and the tail current Itn supplied to the NMOS input differential pair 12 increases. Accordingly, the PMOS input differential pair 10 and the NMOS input differential pair 12 are switched according to the common-mode input voltage VCM.

A mismatch of the transistors M1 and M2, a mismatch of the transistors M3 and M4, a mismatch of the transistors M5 and M6, and a mismatch of the transistors M9 and M10 may cause an input offset voltage of the operational amplifier 1R.

One example method for reducing the input offset voltage is trimming resistance values of resistors R1 and R2 of the lower-side circuit 21.

FIG. 2 is a diagram illustrating a relation between the input offset voltage and the common-mode input voltage VCM in the operational amplifier 1R of FIG. 1. A characteristic (i) represents the input offset voltage before correction. Each of characteristics (ii) and (iii) represent the input offset voltage after trimming for offset correction is performed. As can be seen from the characteristic (ii), when the trimming is performed such that the input offset voltage in an operation region of the PMOS input differential pair 10 decreases, the input offset voltage in an operation region of the NMOS input differential pair 12 increases. As can be seen from the characteristic (iii), when the trimming is performed such that the input offset voltage in the operation region of the NMOS input differential pair 12 decreases, the input offset voltage in the operation region of the PMOS input differential pair 10 increases.

One example of the related art is Japanese Patent Laid-open No. 2010-41131.

SUMMARY

In view of the issue described above, it is desirable to provide an operational amplifier capable of correcting an input offset voltage over a wide voltage range.

An embodiment of the present disclosure relates to an operational amplifier. The operational amplifier includes a non-inverting input terminal that receives a first input voltage; an inverting input terminal that receives a second input voltage; a PMOS input differential pair connected to the non-inverting input terminal and the inverting input terminal; a first input tail current source connected to sources of the PMOS input differential pair; an NMOS input differential pair connected to the non-inverting input terminal and the inverting input terminal; a second input tail current source connected to sources of the NMOS input differential pair; an output stage that receives an output of the PMOS input differential pair and an output of the NMOS input differential pair; a first correction circuit that corrects an offset voltage of the PMOS input differential pair; and a second correction circuit that corrects an offset voltage of the NMOS input differential pair. The first correction circuit and the second correction circuit operate over an operation region of the PMOS input differential pair, an operation region of the NMOS input differential pair, and a transition region in which both the PMOS input differential pair and the NMOS input differential pair operate.

According to this embodiment, an input offset voltage can be corrected over a wide voltage range.

The first correction circuit may include a first correction differential amplifier including a PMOS correction differential pair connected to the non-inverting input terminal and the inverting input terminal, and a first gm amplifier that converts an output signal of the first correction differential amplifier into a current signal and supplies the current signal to the output stage. The second correction circuit may include a second correction differential amplifier including an NMOS correction differential pair connected to the non-inverting input terminal and the inverting input terminal, and a second gm amplifier that converts an output signal of the second correction differential amplifier into a current signal and supplies the current signal to the output stage. The first correction differential amplifier may include, in addition to the PMOS correction differential pair, a first correction tail current source connected to sources of the PMOS correction differential pair, and a first load circuit and a first correction current source each connected to drains of the PMOS correction differential pair. The second correction differential amplifier may include, in addition to the NMOS correction differential pair, a second correction tail current source connected to sources of the NMOS correction differential pair, and a second load circuit and a second correction current source each connected to drains of the NMOS correction differential pair.

The output stage may include a first constant current circuit that mirrors a differential current of the PMOS input differential pair and a differential current of the first correction circuit, a first gate-grounded circuit disposed on a path of the differential currents mirrored by the first constant current circuit, a second constant current circuit that mirrors a differential current of the NMOS input differential pair and a differential current of the second correction circuit, and a second gate-grounded circuit disposed on a path of the differential currents mirrored by the second constant current circuit.

A current of the first input tail current source may decrease as the first input voltage and the second input voltage increase, and a current of the second input tail current source may change in a complementary manner to the current of the first input tail current source. Switching the PMOS input differential pair and the NMOS input differential pair according to an input voltage can reduce wasteful current.

A current of the first input tail current source may decrease as the first input voltage and the second input voltage increase. A current of the second input tail current source and a current of the second gm amplifier may change in a complementary manner to the current of the first input tail current source.

The first gm amplifier may include a PMOS differential pair, a current source disposed on a source side of the PMOS differential pair, and a stop circuit disposed between the PMOS differential pair and the current source and config-ured to switch to an interruption state when a current that flows through the PMOS input differential pair becomes zero.

The first gm amplifier may further include a variable current source that sinks, from a connection node between the current source and the stop circuit, a current that changes in a complementary manner to the current of the first input tail current source.

Any combination of the above-described components and any embodiment with the components or the expressions of the present disclosure replaced between a method, an apparatus, a system, etc., are also effective as an embodiment of the present disclosure.

According to an embodiment of the present disclosure, an input offset voltage can be corrected over a wide voltage range.

BRIEF DESCRIPTION OF THE DRAWINGS

FIG. 10 is a circuit diagram illustrating a specific example of a configuration of the operational amplifier of FIG. 3;

FIG. 14A is a diagram illustrating an offset voltage of a buffer including the operational amplifier of FIG. 12, while

DETAILED DESCRIPTION OF THE PREFERRED EMBODIMENTS

Figure 1:
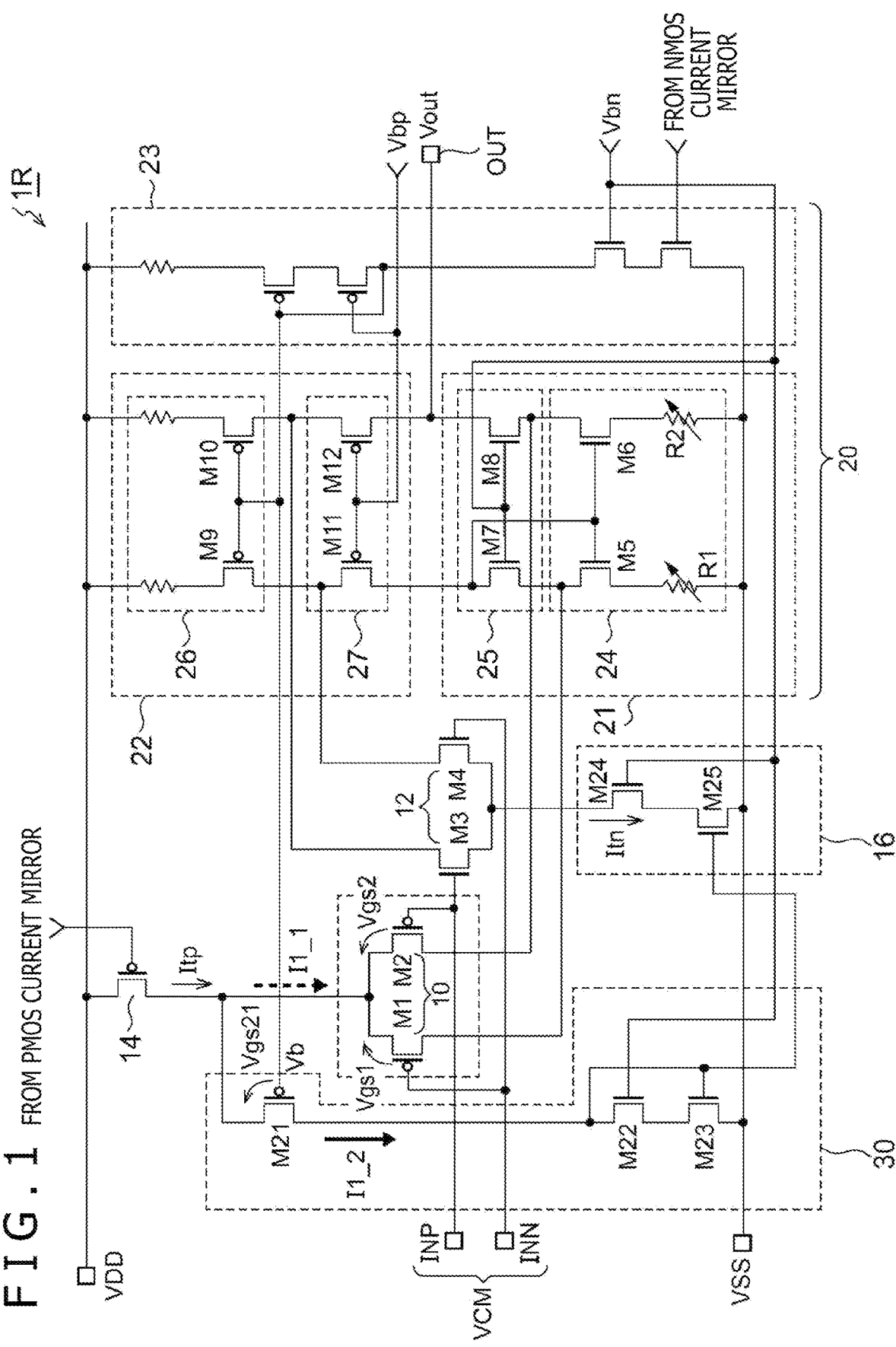
FIG. 1 is a circuit diagram of a Rail-To-Rail folded cascode operational amplifier.
Figure 2:
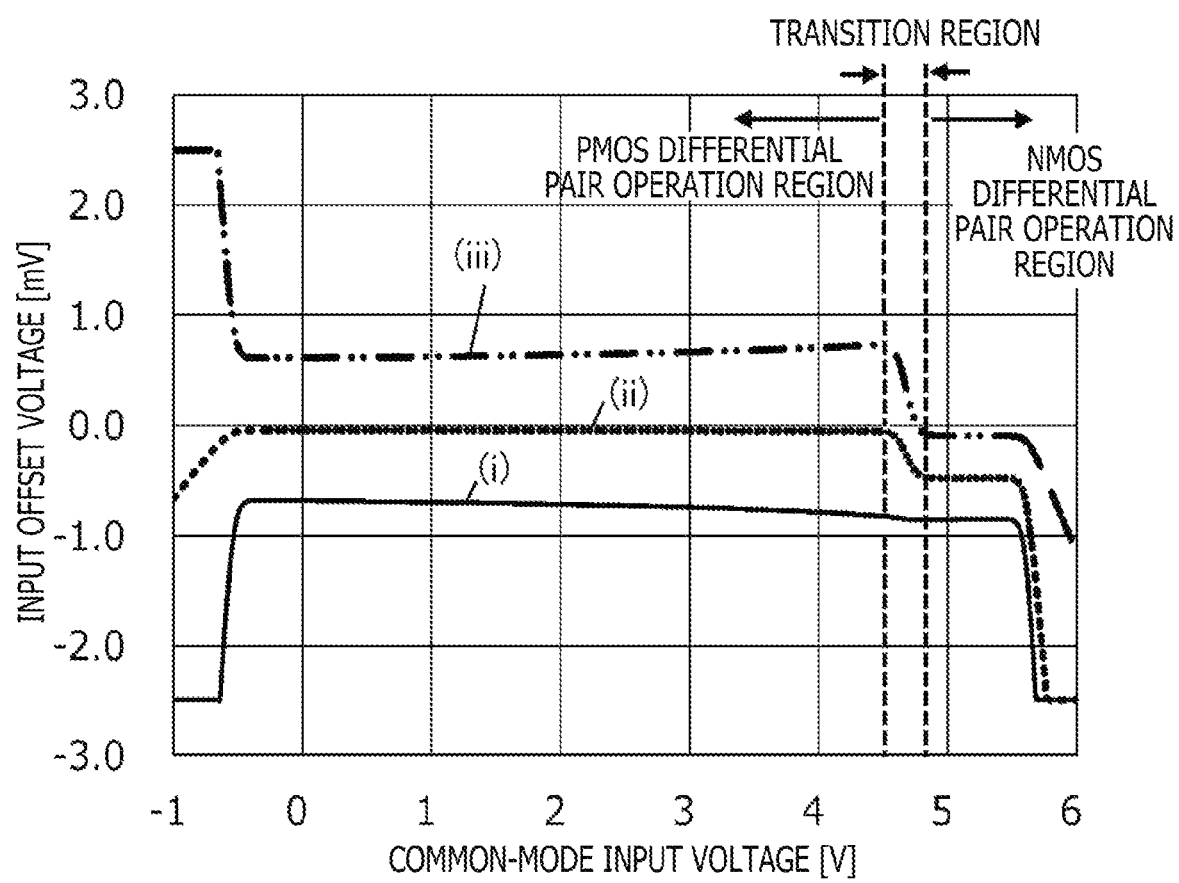
FIG. 2 is a diagram illustrating a relation between an input offset voltage and a common-mode input voltage VCM in the operational amplifier of FIG. 1.

The present disclosure will now be described based on preferred embodiments with reference to the drawings. The same or equivalent components, members, and processes illustrated in the drawings will be denoted by the same reference signs, and redundant description will be omitted as appropriate. The embodiments will be described for exemplary purposes only and are by no means intended to limit the present disclosure. All the features and combinations thereof described in the embodiments are not necessarily essential to the disclosure.

In the present specification, a "state in which a member A is connected to a member B" includes not only a state in which the member A and the member B are physically directly connected to each other but also a state in which the member A and the member B are indirectly connected to each other via another member that does not affect an electric connection therebetween.

Similarly, a "state in which a member C is disposed between the member A and the member B" includes not only a state in which the member A and the member C or the member B and the member C are directly connected to each other but also a state in which the member A and the member C or the member B and the member C are indirectly connected to each other via another member that does not affect an electric connection therebetween.

First Embodiment

Figure 3:
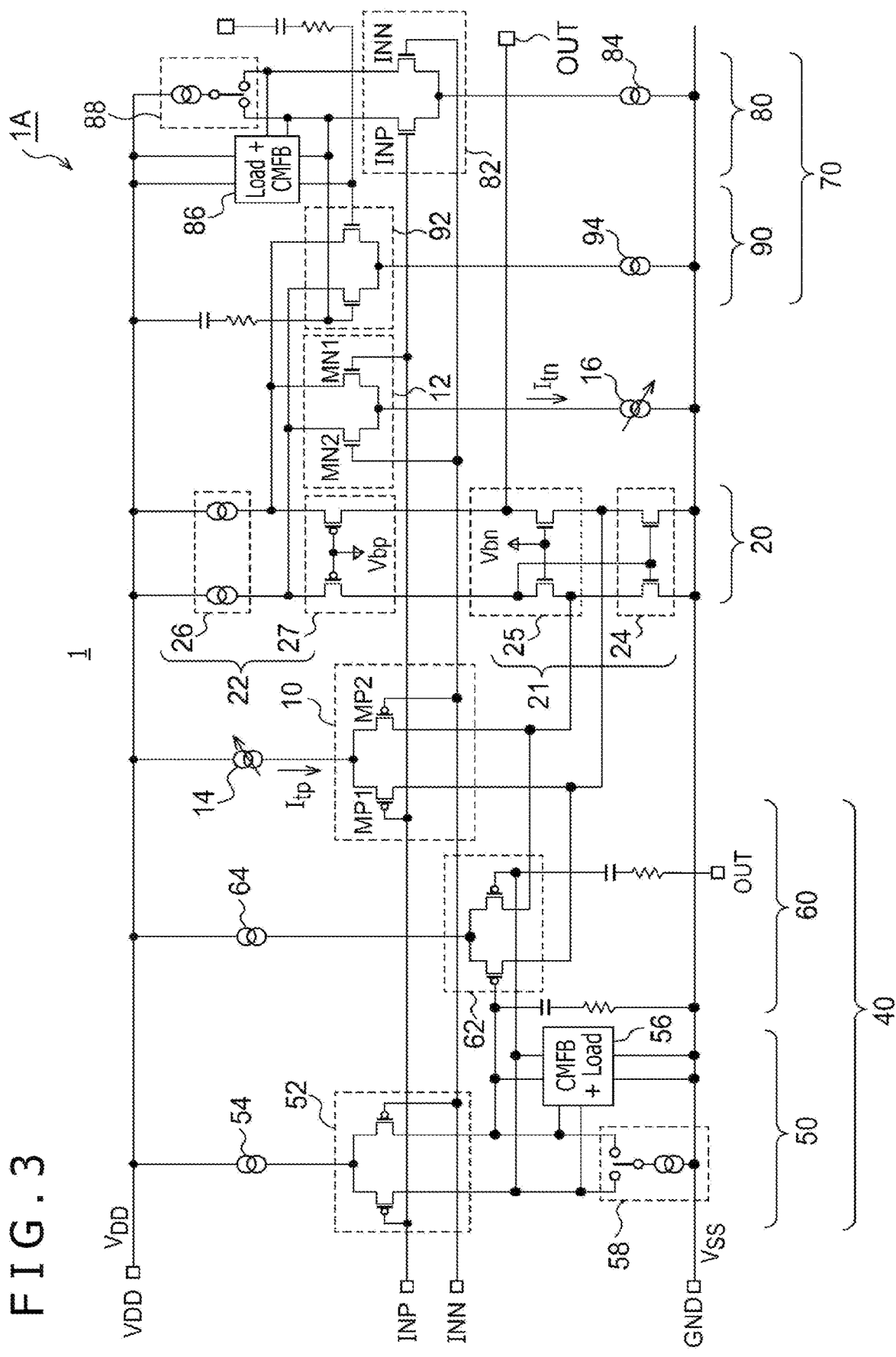
FIG. 3 is a circuit diagram of an operational amplifier according to a first embodiment.

FIG. 3 is a circuit diagram of an operational amplifier 1A according to a first embodiment. The operational amplifier 1A includes a PMOS input differential pair 10, an NMOS input differential pair 12, a first input tail current source 14, a second input tail current source 16, an output stage 20, a first correction circuit 40, and a second correction circuit 70.

A first input voltage $V_+$ is input into a non-inverting input terminal INP, while a second input voltage $V_-$ is input into an inverting input terminal INN. An upper-side power supply voltage is input into an upper-side power supply terminal VDD, while a lower-side power supply voltage (e.g., ground voltage) is supplied to a lower-side power supply terminal (ground terminal) VSS. The operational amplifier 1A amplifies the difference between the first input voltage $V_+$ and the second input voltage $V_-$ and outputs an output voltage Vout from an output terminal OUT.

The PMOS input differential pair 10, the NMOS input differential pair 12, the first input tail current source 14, the second input tail current source 16, and the output stage 20 constitute a Rail-To-Rail folded cascode operational amplifier.

The PMOS input differential pair 10 includes two PMOS transistors MP1 and MP2. A gate of one of the PMOS transistors MP1 and MP2 is connected to the inverting input terminal INN, while a gate of the other one of the PMOS transistors MP1 and MP2 is connected to the non-inverting input terminal INP.

The NMOS input differential pair 12 includes two NMOS transistors MN1 and MN2. A gate of one of the NMOS transistors MN1 and MN2 is connected to the non-inverting input terminal INP, while a gate of the other one of the NMOS transistors MN1 and MN2 is connected to the inverting input terminal INN.

The first input tail current source 14 supplies a first tail current Itp to the PMOS input differential pair 10. The second input tail current source 16 supplies a second tail current Itn to the NMOS input differential pair 12.

The output stage 20 includes an upper-side circuit 22 and a lower-side circuit 21, which are vertically stacked between a power supply line VDD and a ground line VSS. The lower-side circuit 21 is connected to the PMOS input differential pair 10, while the upper-side circuit 22 is connected to the NMOS input differential pair 12. The output terminal OUT is drawn from a node of the inside of the output stage 20. In this example, a connection node between the upper-side circuit 22 and the lower-side circuit 21 serves as an OUT terminal.

The first correction circuit 40 corrects an offset voltage $V_{OSP}$ of the PMOS input differential pair 10. The second correction circuit 70 corrects an offset voltage $V_{OSN}$ of the NMOS input differential pair 12.

The configurations of the first correction circuit 40 and the second correction circuit 70 are not limited. The first correction circuit 40 of FIG. 3 includes a first correction differential amplifier 50 and a first gm amplifier 60. The first correction differential amplifier 50 includes a PMOS correction differential pair 52, a first correction tail current source 54, a first load circuit 56, and a first offset current source 58. The PMOS correction differential pair 52 is connected to the non-inverting input terminal INP and the inverting input terminal INN.

A differential current corresponding to an offset flows through the PMOS correction differential pair 52. The differential current is converted into a voltage signal by the first load circuit 56. The first load circuit 56 also operates as a common-mode feedback circuit.

The first gm amplifier 60 includes a PMOS differential pair 62 and a current source 64 and converts the differential voltage signal, which is the output of the first correction differential amplifier 50, into a differential current signal. The differential current signal is supplied to the lower-side circuit 21 of the output stage 20.

The first correction differential amplifier 50 can cancel the input offset voltage $V_{OSP}$ of the PMOS input differential pair 10 by adjusting the amount of current generated by the first offset current source 58 and its polarity.

The second correction circuit 70 includes a second correction differential amplifier 80 and a second gm amplifier 90 and has a configuration similar to that of the first correction circuit 40. The second correction differential amplifier 80 has a configuration similar to that of the first correction differential amplifier 50 and includes an NMOS correction differential pair 82, a second correction tail current source 84, a second load circuit 86, and a second offset current source 88.

The second gm amplifier 90 includes an NMOS differential pair 92 and a current source 94 and has a configuration similar to that of the first gm amplifier 60. The second correction differential amplifier 80 can cancel the input offset voltage $V_{OSN}$ of the NMOS input differential pair 12 by adjusting the amount of current generated by the second offset current source 88 and its polarity.

When the operational amplifier 1A is incorporated into a feedback loop, the first input voltage $V_+$ and the second input voltage $V_-$ are substantially equal to each other (virtual ground). In a region in which these equal input voltages $V_+$ and $V_-$ are low (this region will be hereinafter referred to as a "PMOS differential pair operation region"), the operation of the PMOS input differential pair 10 is dominant. In a region in which these equal input voltages $V_+$ and $V_-$ are high (this region will be hereinafter referred to as an "NMOS differential pair operation region"), the operation of the NMOS input differential pair 12 is dominant. A voltage range in which both the PMOS input differential pair 10 and the NMOS input differential pair 12 operate will be hereinafter referred to as a "transition region."

Figure 4:
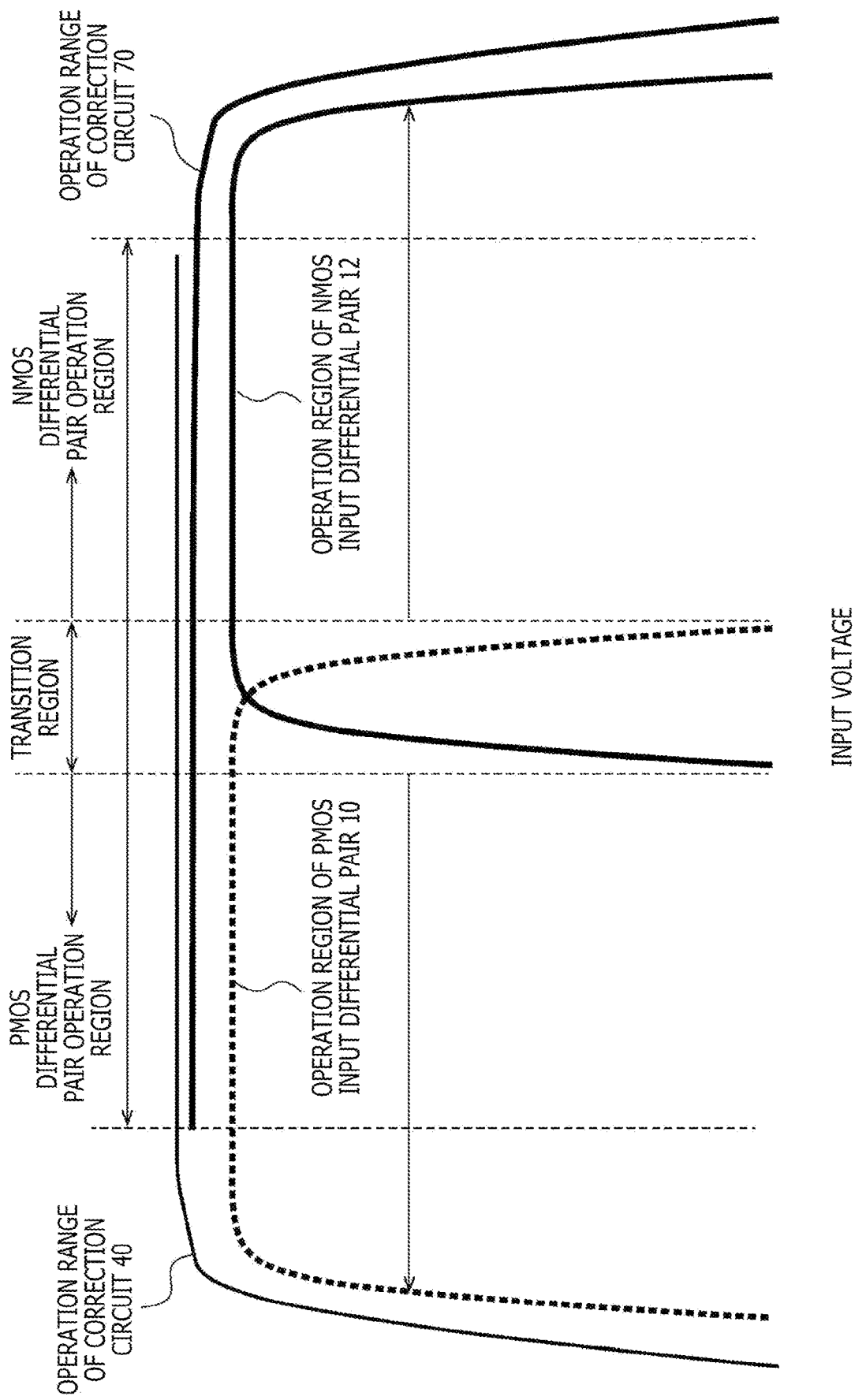
FIG. 4 is a diagram illustrating operation ranges of a first correction circuit and a second correction circuit.

FIG. 4 is a diagram illustrating operation ranges of the first correction circuit 40 and the second correction circuit 70. Both the first correction circuit 40 and the second correction circuit 70 operate over the PMOS differential pair operation region, the NMOS differential pair operation region, and the transition region in which both the PMOS input differential pair 10 and the NMOS input differential pair 12 operate.

The configuration of the operational amplifier 1A is as described above. Before the operation of the operational amplifier 1A is described, an operational amplifier 1S will be examined. The operational amplifier 1S has a simplified configuration (hereinafter referred to as a "comparative technique 1") from the configuration of the operational amplifier 1A.

(Comparative Technique 1)

Figure 5:
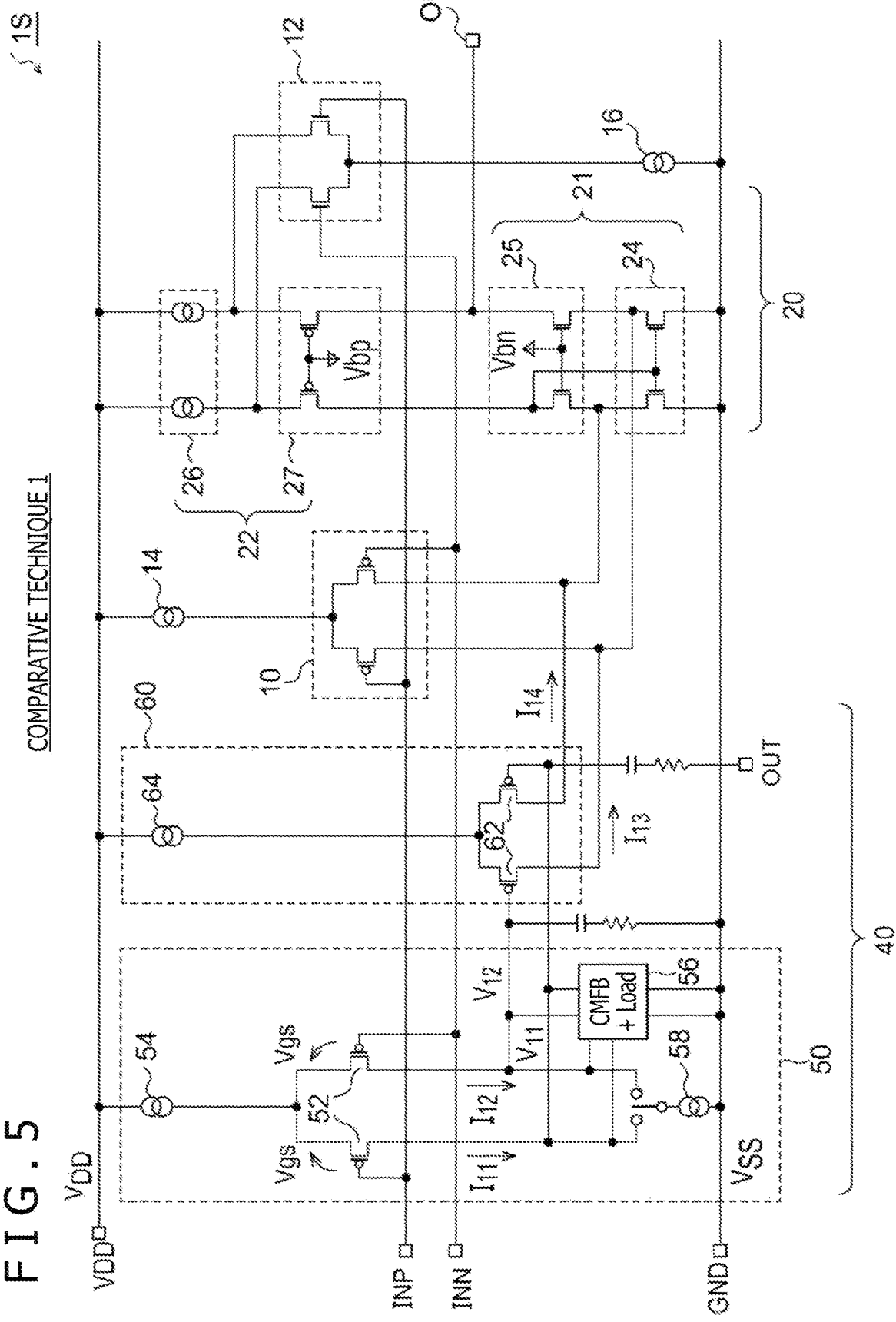
FIG. 5 is an equivalent circuit diagram of an operational amplifier according to a comparative technique 1.

FIG. 5 is an equivalent circuit diagram of the operational amplifier 1S according to the comparative technique 1. This configuration can be regarded as a configuration in which the second correction circuit 70 is omitted from the operational amplifier 1A of FIG. 3.

Figure 6:
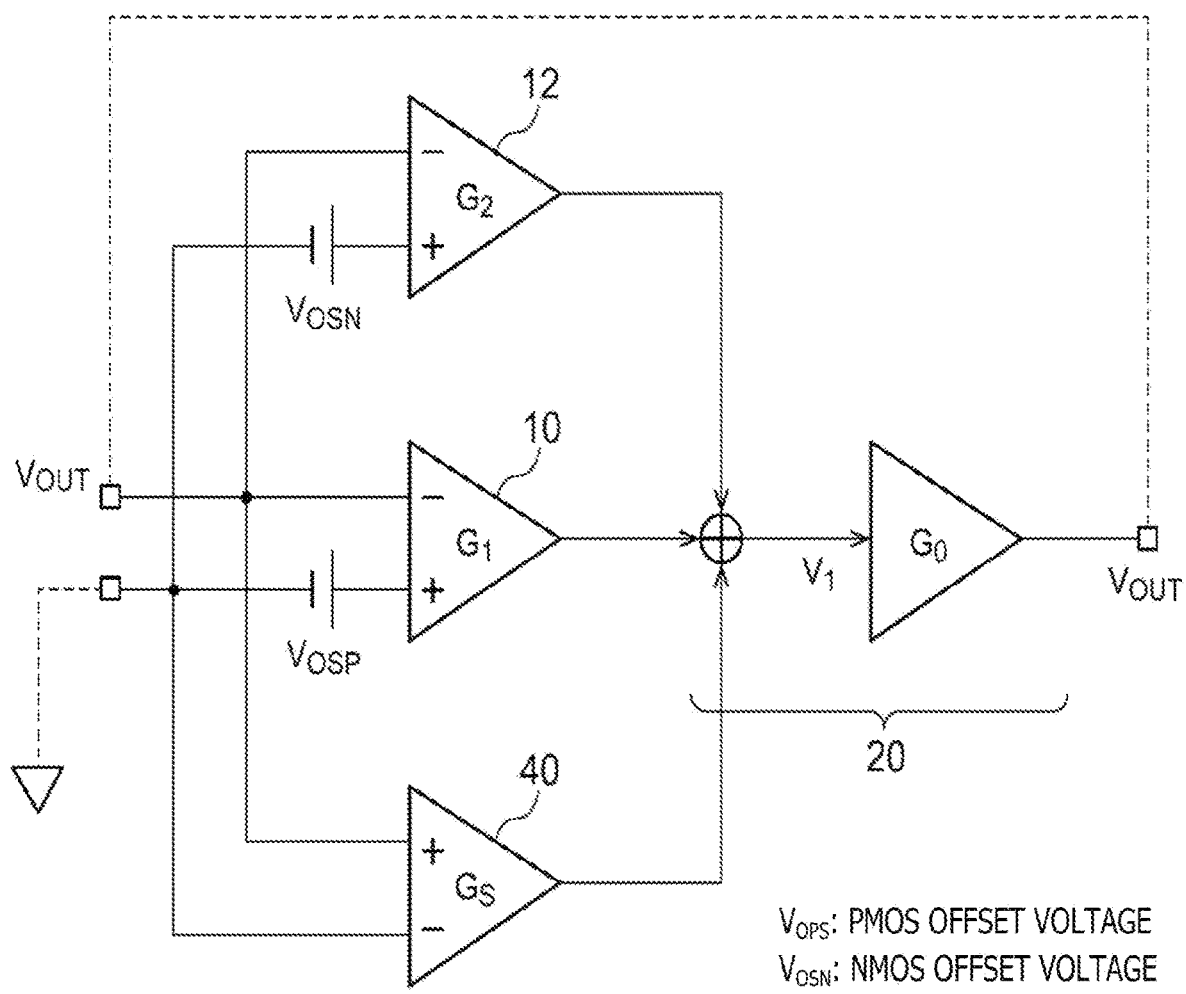
FIG. 6 is an equivalent circuit diagram of a buffer circuit including the operational amplifier of FIG. 5.

FIG. 6 is an equivalent circuit diagram of a buffer circuit including the operational amplifier 1S of FIG. 5. The operations of the PMOS input differential pair 10 and the NMOS input differential pair 12 switch according to the input voltages $V_+$ and $V_+$. The PMOS input differential pair 10 and the NMOS input differential pair 12 include the offset voltages $V_{OSP}$ and $V_{OSN}$, respectively. The offset voltage of the first correction circuit 40 can be assumed to be zero. "$G_1$," "$G_2$," "$G_S$," and "$G_0$" each represent a voltage gain of each stage.

An effect of an offset voltage $V_{OFS}$ on the output voltage $V_{OUT}$ in the operational amplifier 1S is examined.

$$(V_{OSP}-V_{OUT})G_1-V_{OUT}{\times}G_S=V_1$$

$$V_{OUT}=V_1{\times}G_0$$

$$V_{OUT}=G_0\{(V_{OSP}-V_{OUT})G_1-V_{OUT}{\times}G_S\}$$

$$V_{OUT}/G_0=(V_{OSP}-V_{OUT})G_1-V_{OUT}{\times}GS{\approx}0$$

$$V_{OUT}(G_1+G_S)=V_{OSP}G_1$$

$$V_{OUT}=V_{OSP}/(1+G_S/G_1)$$

That is, when the gain $G_S$ of the first correction circuit 40 is sufficiently large and $G_S{\gg}G_1$ holds, the effect of the offset voltage $V_{OSP}$ of the main amplifier can be significantly reduced. The offset voltage $V_{OSN}$ of the NMOS input differential pair 12 is output as it is without being corrected.

Figure 7:
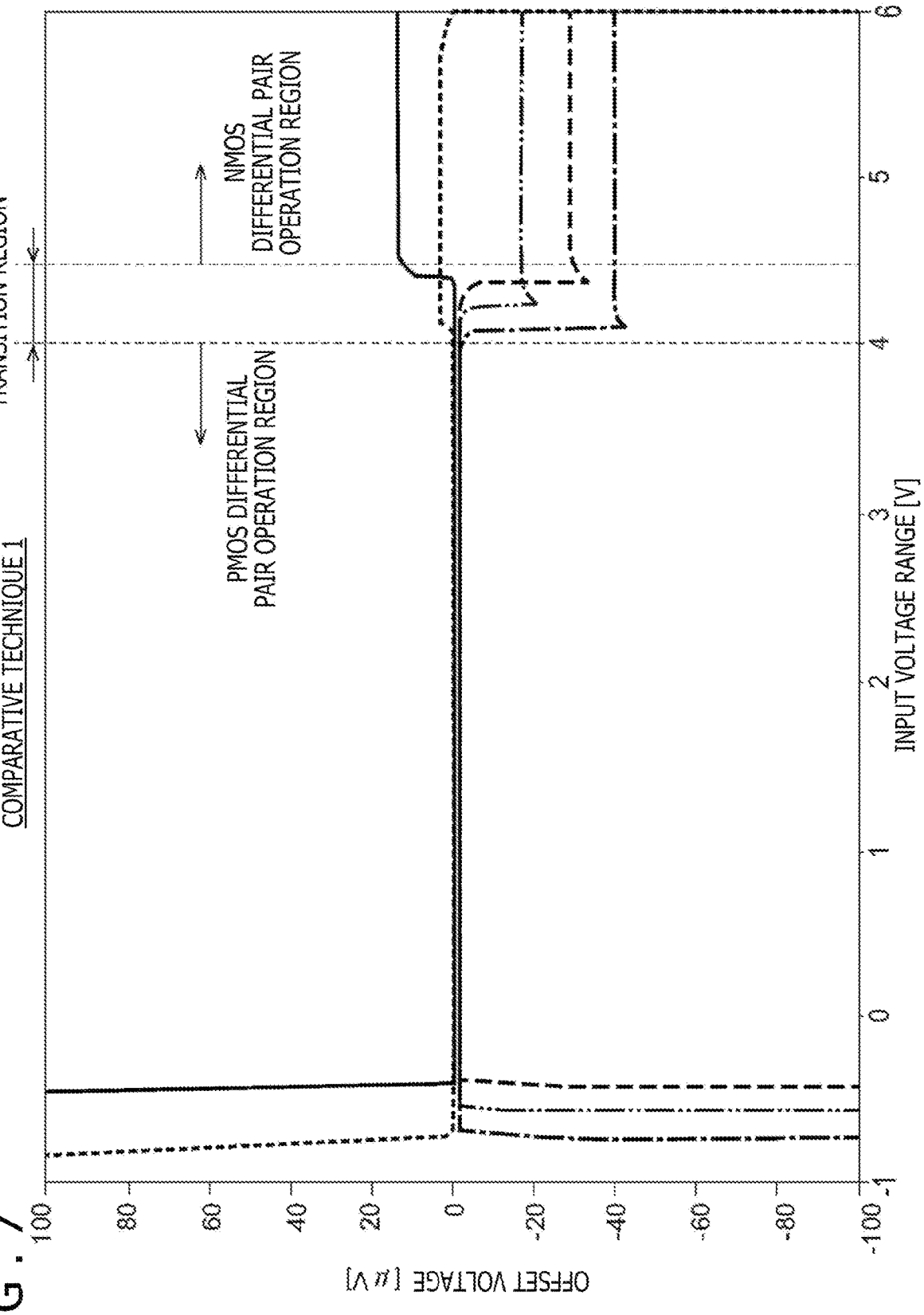
FIG. 7 is a diagram illustrating an offset voltage of a buffer including the operational amplifier of FIG. 5.

FIG. 7 is a diagram illustrating the offset voltage $V_{OFS}$ (simulation result) of a buffer including the operational amplifier 1S of FIG. 5. The offset voltage $V_{OFS}$ is recognized as the difference $V_{OUT}-V_{REF}$ between the output voltage $V_{OUT}$ and a reference voltage $V_{REF}$. A vertical axis represents the offset voltage $V_{OFS}$ while a horizontal axis represents the input voltage (reference voltage $V_{REF}$).

With the comparative technique 1, the offset voltage of the NMOS input differential pair 12 is not corrected. Consequently, the offset voltage $V_{OFS}$ becomes large in the transition region and the NMOS differential pair operation region.

Figure 8:
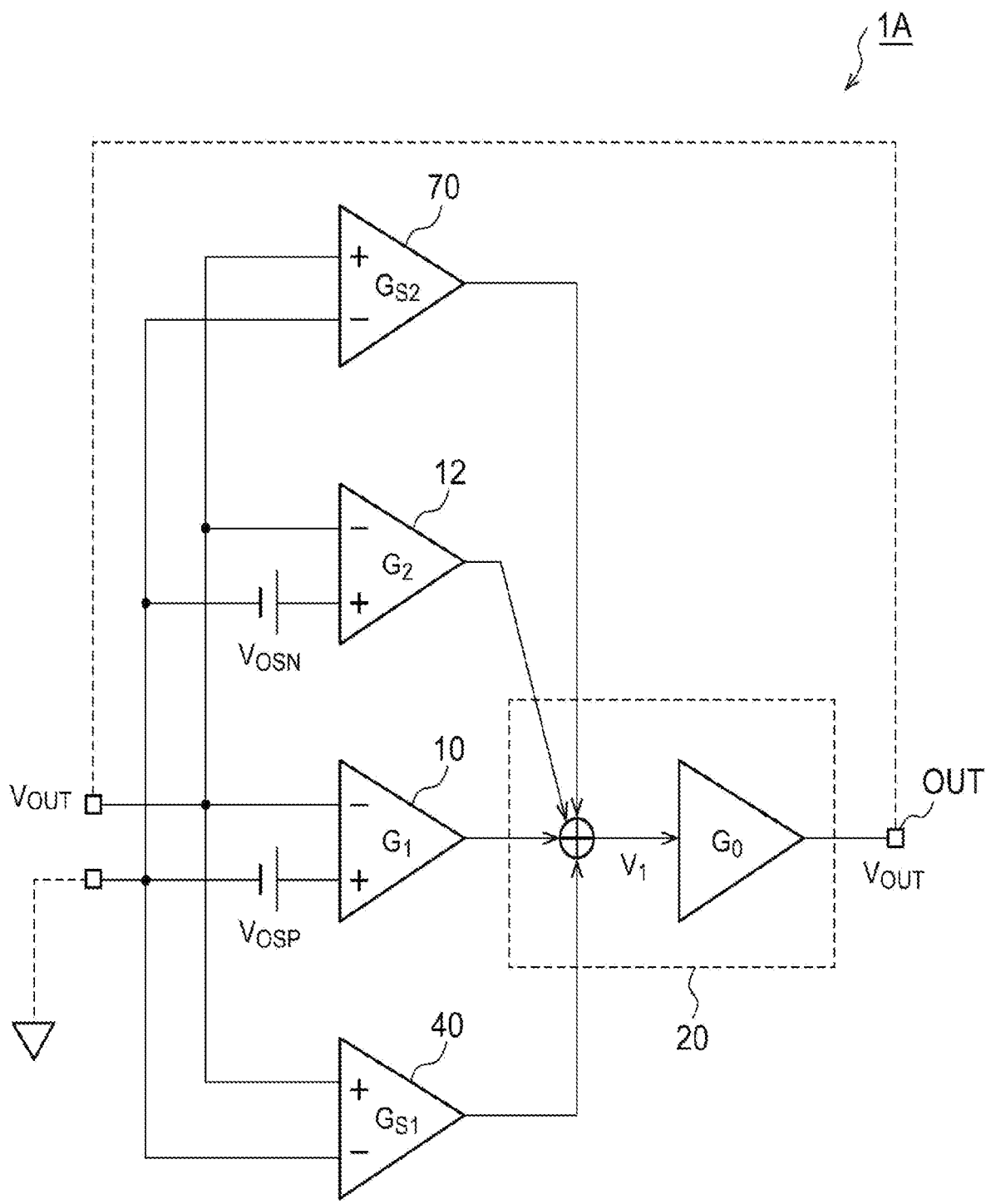
FIG. 8 is an equivalent circuit diagram of a buffer circuit including the operational amplifier of FIG. 3.

Return to the description of the operation of the operational amplifier 1A according to the first embodiment. FIG. 8 is an equivalent circuit diagram of a buffer circuit including the operational amplifier 1A of FIG. 3. The offset voltages of the first correction circuit 40 and the second correction circuit 70 can be assumed to be zero. "$G_1$," "$G_2$," "$G_{S1}$," "$G_{S2}$," and "$G_0$" each represent a voltage gain of each stage.

An effect of the offset voltage $V_{OSP}$ included in the output voltage $V_{OUT}$ in the PMOS differential pair operation region is expressed by the following equation.

$$V_{OUT}=V_{OSP}/(1+G_{S1}/G_1)$$

Therefore, when $G_{S1}{\gg}G_1$ holds, the effect of the offset voltage $V_{OSP}$ is corrected by the first correction circuit 40.

An effect of the offset voltage $V_{OSN}$ included in the output voltage $V_{OUT}$ in the NMOS differential pair operation region is expressed by the following equation.

$$V_{OUT}=V_{OSN}/(1+G_{S2}/G_2)$$

Therefore, when $G_{S2}{\gg}G_2$ holds, the effect of the offset voltage $V_{OSN}$ is corrected by the second correction circuit 70.

The following focuses on the transition region. In the transition region, both the first correction circuit 40 and the second correction circuit 70 operate. An effect of the offset voltage $V_{OSP}$ included in the output voltage $V_{OUT}$ is expressed by the following equation.

$$V_{OUT}=V_{OSP}/(1+(G_{S1}+G_{S2})/G_1)$$

Since $(G_{S1}+G_{S2}){\gg}G_1$ holds, the effect of the offset voltage $V_{OSP}$ is corrected by both the first correction circuit 40 and the second correction circuit 70.

Similarly, an effect of the offset voltage $V_{OSN}$ included in the output voltage $V_{OUT}$ is expressed by the following equation.

$$V_{OUT}=V_{OSN}/(1+(G_{S1}+G_{S2})/G_2)$$

Since $(G_{S1}+G_{S2}){\gg}G_2$ holds, the effect of the offset voltage $V_{OSN}$ is corrected by both the first correction circuit 40 and the second correction circuit 70.

Figure 9:
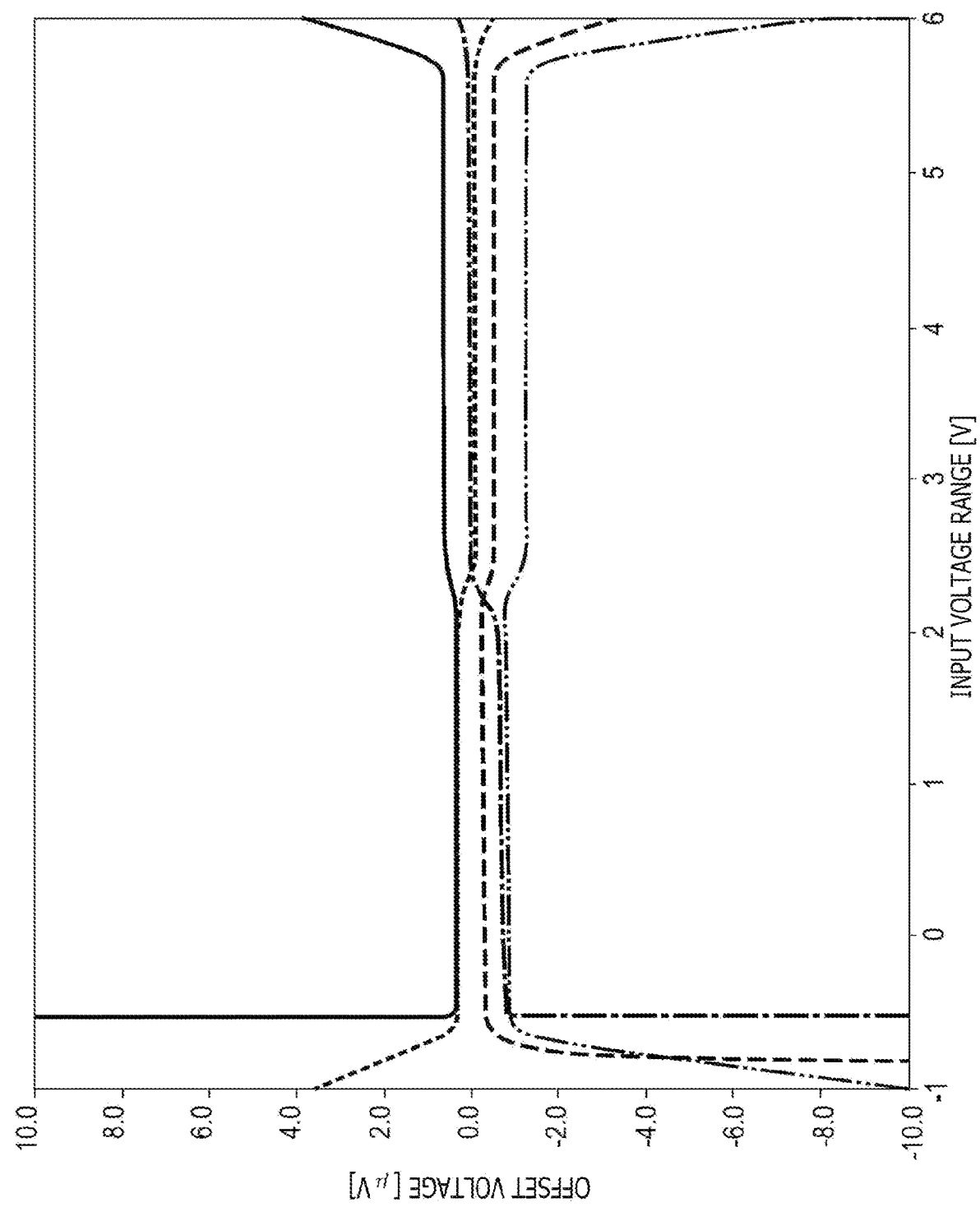
FIG. 9 is a diagram illustrating an offset voltage of a buffer including the operational amplifier of FIG. 3.

FIG. 9 is a diagram illustrating the offset voltage $V_{OFS}$ (simulation result) of a buffer including the operational amplifier 1A of FIG. 3. The operational amplifier 1A of FIG. 3 can reduce the offset voltage $V_{OFS}$ over a wide input voltage range.

Particularly, in the transition region, the offset voltage $V_{OSP}$ of the PMOS input differential pair 10 can be corrected not only by the first correction circuit 40 but also by the second correction circuit 70. Therefore, the effect of the offset voltage $V_{OSP}$ of the PMOS input differential pair 10 in the transition region is smaller than that of the comparative technique 1.

Similarly, in the transition region, the offset voltage $V_{OSN}$ of the NMOS input differential pair 12 can be corrected not only by the second correction circuit 70 but also by the first correction circuit 40.

FIG. 10 is a circuit diagram illustrating a specific example of the configuration of the operational amplifier 1A of FIG. 3. The current Itp of the first input tail current source 14 decreases as the first input voltage $V_+$ and the second input voltage $V_-$ increase. For example, the first input tail current source 14 includes PMOS transistors MP3 and MP4. A current mirror voltage $V_{CMP}$ is input into a gate of the PMOS transistor MP3 such that a constant current $Ip_0$ flows.

A constant voltage Vp generated by a bias circuit 23 is input into a gate of the PMOS transistor MP4. A current $I_{P4}$ resulting from $Ip_0$–Itp flows through the PMOS transistor MP4. This current is copied by a current mirror circuit including NMOS transistors MN4 and MN3. The NMOS transistor MN3 corresponds to the second input tail current source 16. In other words, the current Itn of the second input tail current source 16 increases as the current Itp of the first input tail current source 14 decreases.

The PMOS differential pair 62 includes PMOS transistors MP5 and MP6. The current source 64 includes a PMOS transistor MP7. The PMOS correction differential pair 52 includes PMOS transistors MP12 and MP13. The first correction tail current source 54 includes a PMOS transistor MP14. The current mirror voltage $V_{CMP}$ is applied to gates of the PMOS transistors MP7 and MP14 such that a constant current flows.

The output stage 20 includes PMOS transistors MP8 to MP11 and NMOS transistors MN7 to MN10. The current mirror voltage $V_{CMP}$ is applied to gates of the PMOS transistors MP10 and MP11 such that a constant current flows.

A bias voltage Vbp is applied to gates of the PMOS transistors MP8 and MP9. The bias voltage Vbp is generated by a bias circuit, not illustrated. The bias voltage Vbp may be equal to the current mirror voltage $V_{CMP}$.

A constant current circuit 24 and a gate-grounded circuit 25 constitute a low-voltage cascode current mirror circuit. A bias voltage Vbn is applied to gates of the NMOS transistors MN7 and MN8, which serve as the gate-grounded circuit 25. The bias voltage Vbn may be equal to a current mirror voltage $V_{CMN}$.

The NMOS differential pair 92 includes NMOS transistors MN5 and MN6. The current source 94 includes the NMOS transistor MN6. The NMOS correction differential pair 82 includes NMOS transistors MN11 and MN12. The second correction tail current source 84 includes an NMOS transistor MN13.

The current mirror voltage $V_{CMN}$ is applied to gates of the NMOS transistors MN6 and MN13 such that a constant current flows.

The configuration of the operational amplifier 1A is not limited to the configuration illustrated in FIG. 10. For example, the constant current sources 84, 94, and 16 on the ground line (GND) side may be configured by a cascode current mirror circuit in which NMOS transistors are stacked in two stages.

Second Embodiment

Figure 11A:
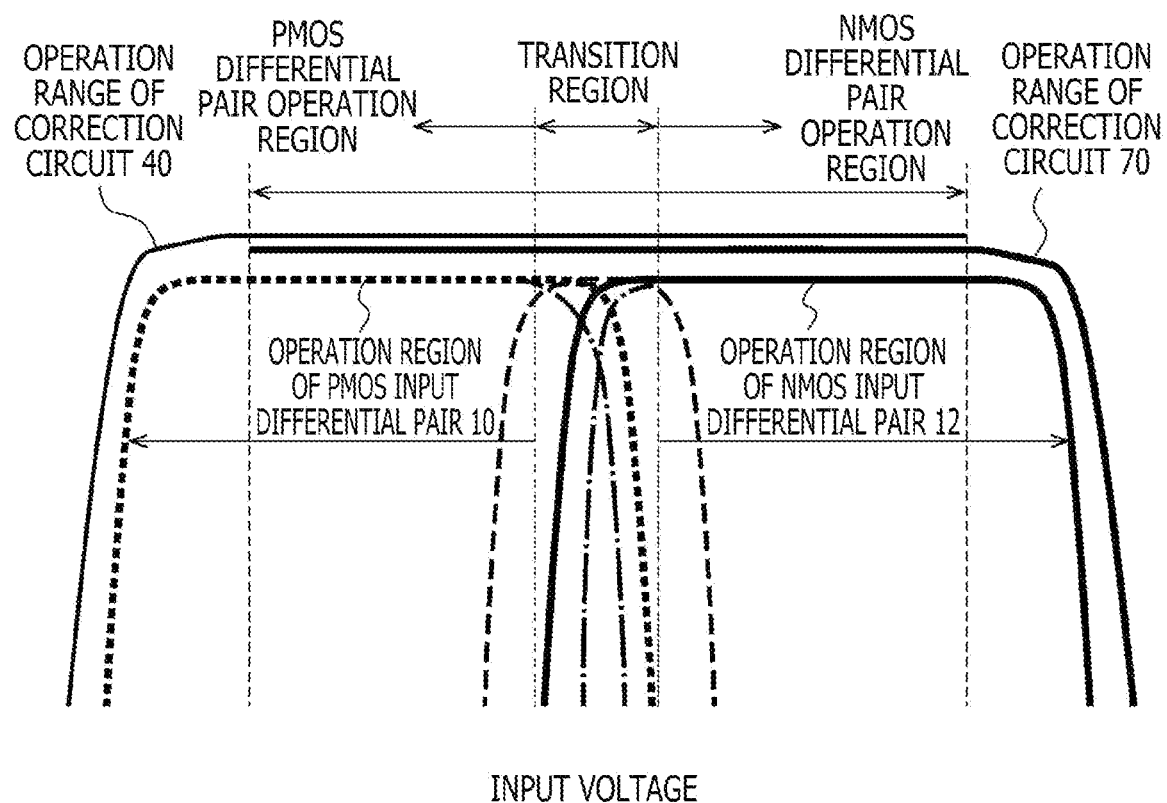
FIGS. 11A and 11B are diagrams illustrating a peak and a dip of the offset voltage in a transition region.
Figure 11B:
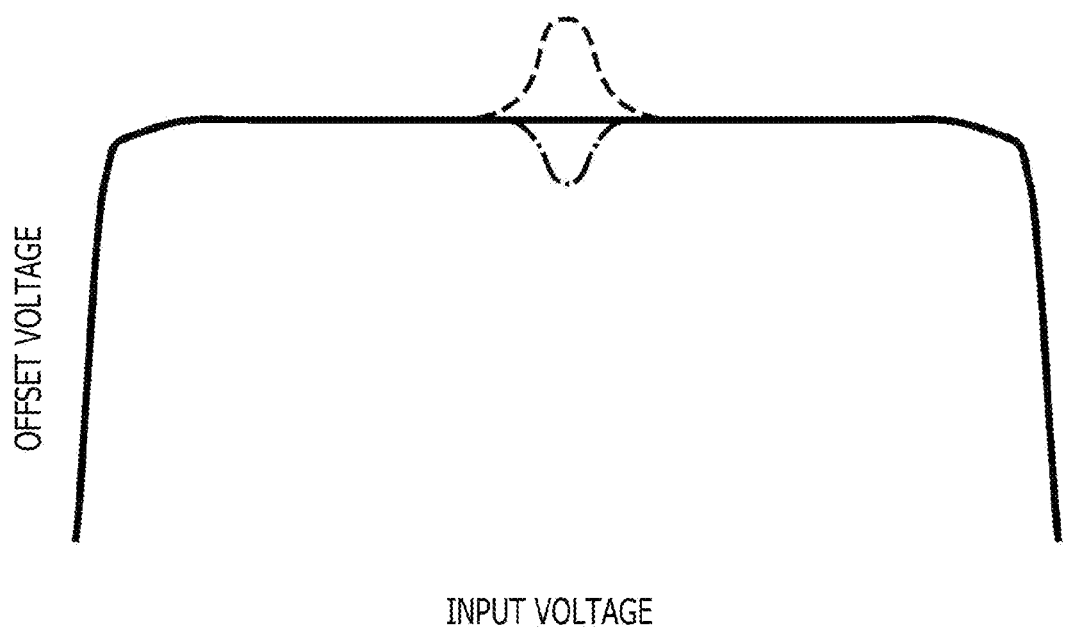

If threshold voltages of the PMOS transistors included in the PMOS input differential pair 10 and the NMOS transistors included in the NMOS input differential pair 12 vary, the offset voltage may have a peak or a dip in the transition region. FIGS. 11A and 11B are diagrams illustrating the peak and the dip of the offset voltage in the transition region. As illustrated in FIG. 11A, the operation regions of the PMOS input differential pair 10 and the NMOS input differential pair 12 vary as denoted by dashed-dotted lines and dashed lines. Due to this variation, as illustrated in FIG. 11B, a peak (dashed line) or a dip (dashed-dotted line) may, in some cases, occur in the offset voltage in the transition region. In the second embodiment, a technique for flattening the offset voltage in the transition region will be described.

Figure 12:
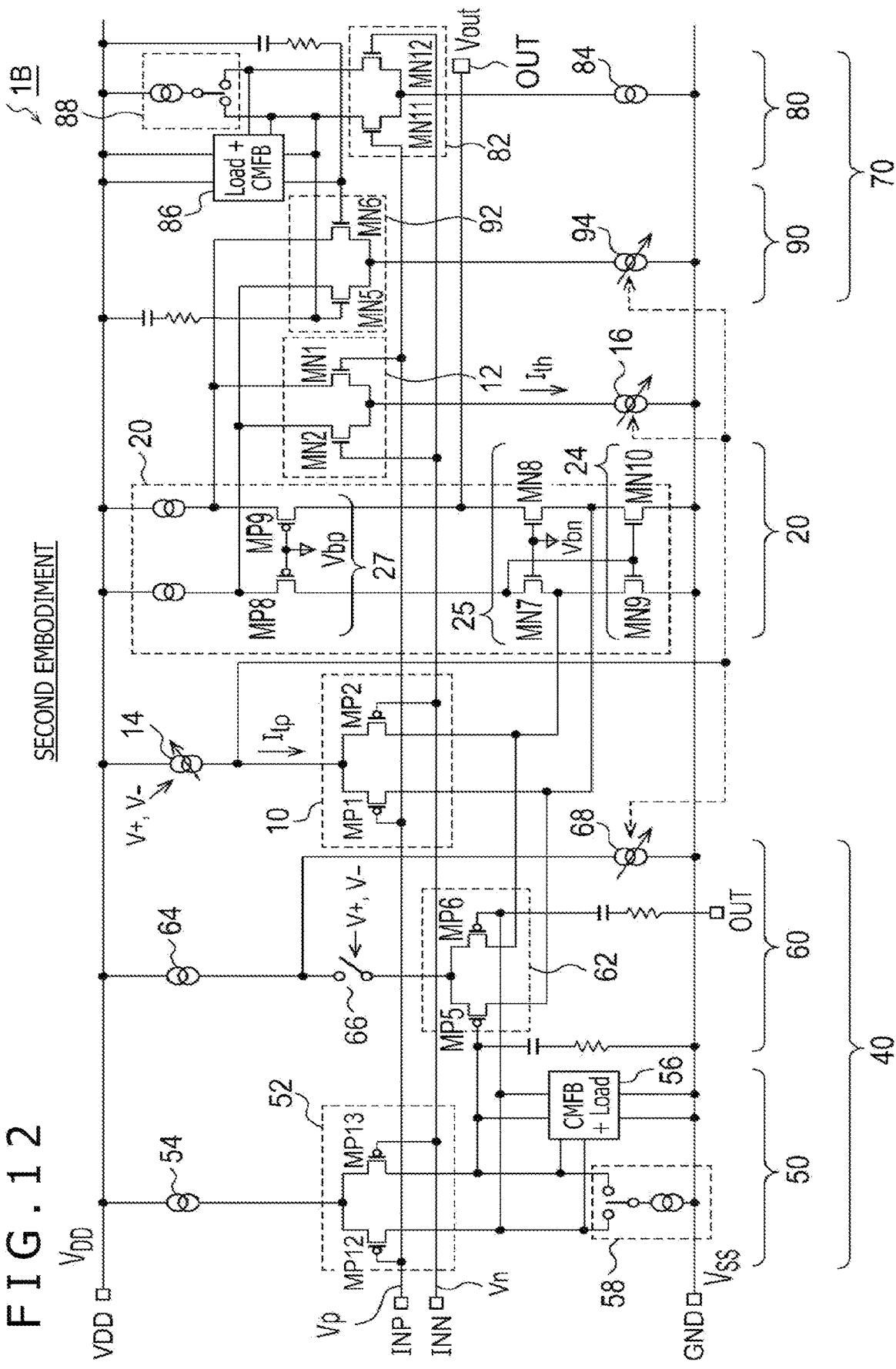
FIG. 12 is a circuit diagram of an operational amplifier according to a second embodiment.

FIG. 12 is a circuit diagram of an operational amplifier 1B according to a second embodiment. The following focuses on the differences between the first embodiment and the second embodiment, omitting their common points.

As described above, the tail current Itp generated by the first input tail current source 14 decreases as the input voltages $V_+$ and $V_-$ increase.

In the first embodiment, the second input tail current source 16 operates in a complementary manner to the first input tail current source 14, and as the tail current Itp decreases, the tail current Itn increases. By contrast, the current source 94 of the second gm amplifier 90 generates a constant current independent of the input voltages $V_+$ and $V_-$.

On the other hand, in the second embodiment, the current of the second input tail current source 16 and the current of the current source 94 of the second gm amplifier 90 change in a complementary manner to the current of the first input tail current source 14.

The first gm amplifier 60 includes a stop circuit 66 and a variable current source 68 in addition to the PMOS differential pair 62 and the current source 64. When the stop circuit 66 detects a state in which the current that flows through the PMOS input differential pair 10 becomes zero, the stop circuit 66 switches to an off (interruption) state, interrupting the current to be supplied to the PMOS differential pair 62.

The variable current source 68 sinks current from a connection node between the current source 64 and the stop circuit 66. The current of the variable current source 68 is in conjunction with the second input tail current source 16 and the current source 94 and changes in a complementary manner to the current of the first input tail current source 14.

The first input tail current source 14, the second input tail current source 16, the variable current source 68, and the current source 94 illustrated in FIG. 12 are denoted by variable current source symbols with arrows. The direction of each arrow represents the direction in which the current changes.

Figure 13:
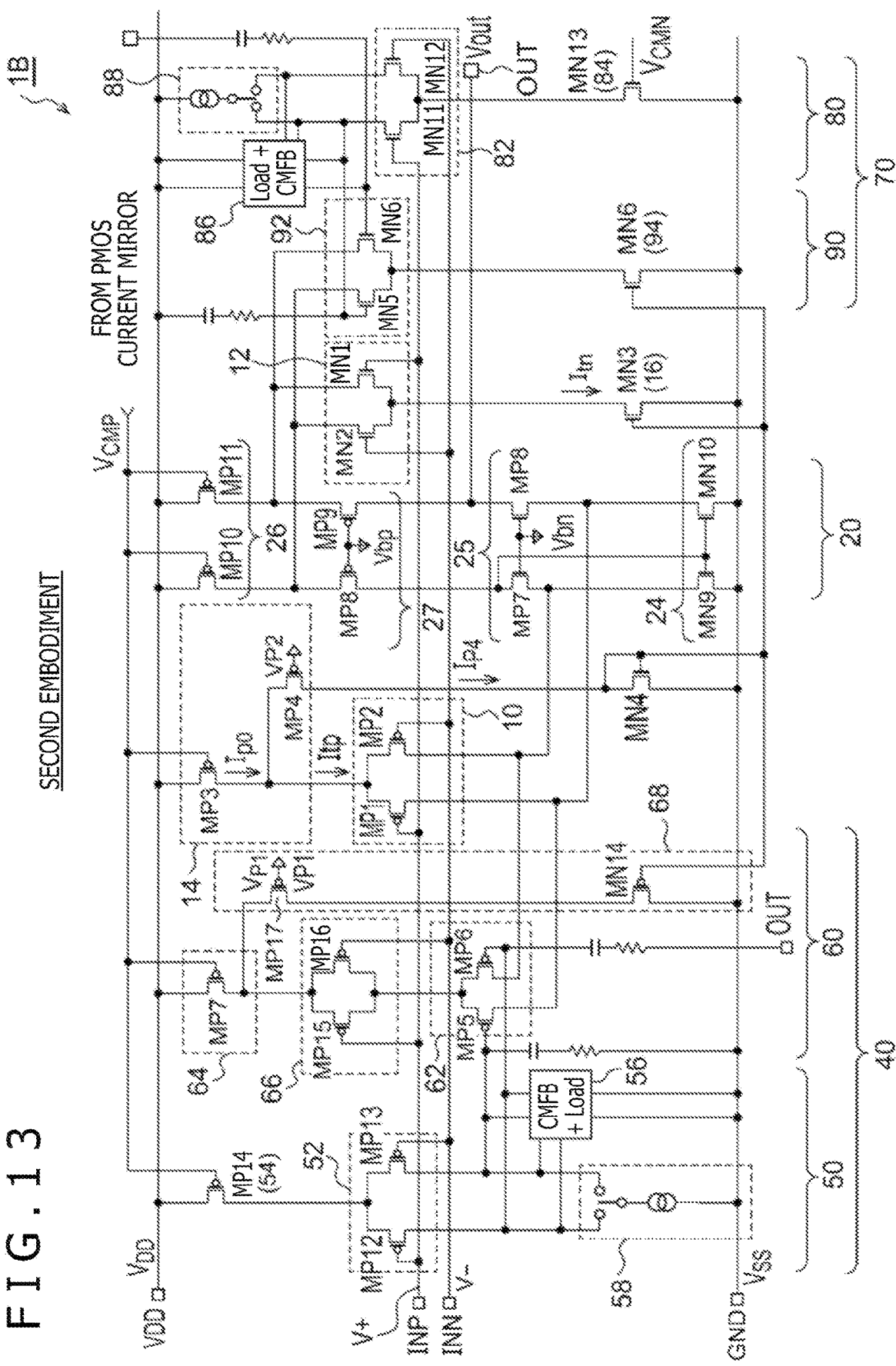
FIG. 13 is a circuit diagram illustrating a specific example of a configuration of the operational amplifier of FIG. 12.

FIG. 13 is a circuit diagram illustrating a specific example of a configuration of the operational amplifier 1B of FIG. 12. The stop circuit 66 includes PMOS transistors MP15 and MP16 disposed such that their sources are connected to each other and their drains are connected to each other. The input voltages $V_+$ and $V_-$ are applied to gates of the PMOS transistors MP15 and MP16, respectively.

The PMOS transistors MP15 and MP16 are replicas of the PMOS transistors MP1 and MP2 of the PMOS input differential pair 10 and operate in conjunction with the state of the PMOS input differential pair 10. When the input voltage $V_+$ and $V_-$ increase and the current that flows through the PMOS input differential pair 10 becomes zero, the stop circuit 66 switches to the off (interruption) state.

The variable current source 68 includes a PMOS transistor MP17 and an NMOS transistor MN14. A gate of the NMOS transistor MN14 is connected to gates of the NMOS transistors MN3, MN4, and MN6, forming a current mirror circuit. The NMOS transistor MN14 sinks current that is in conjunction with the NMOS transistor MN3 (second input tail current source 16).

Figure 14A:
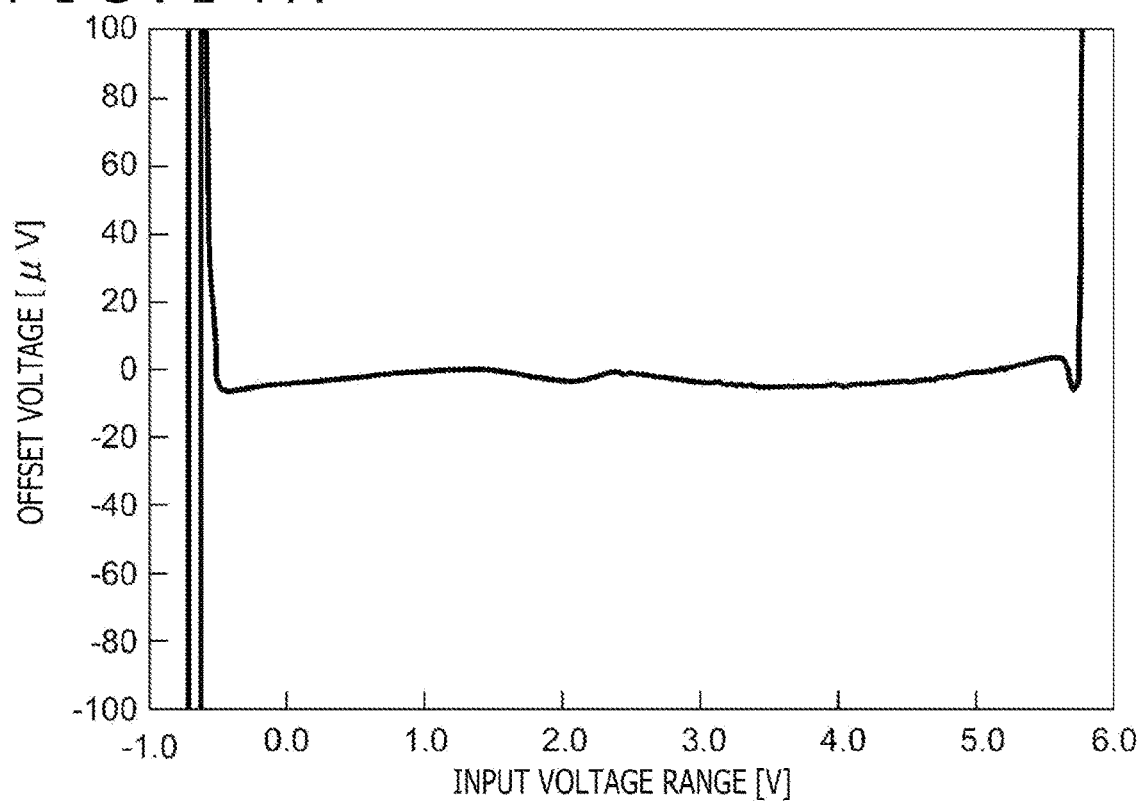
Figure 14B:
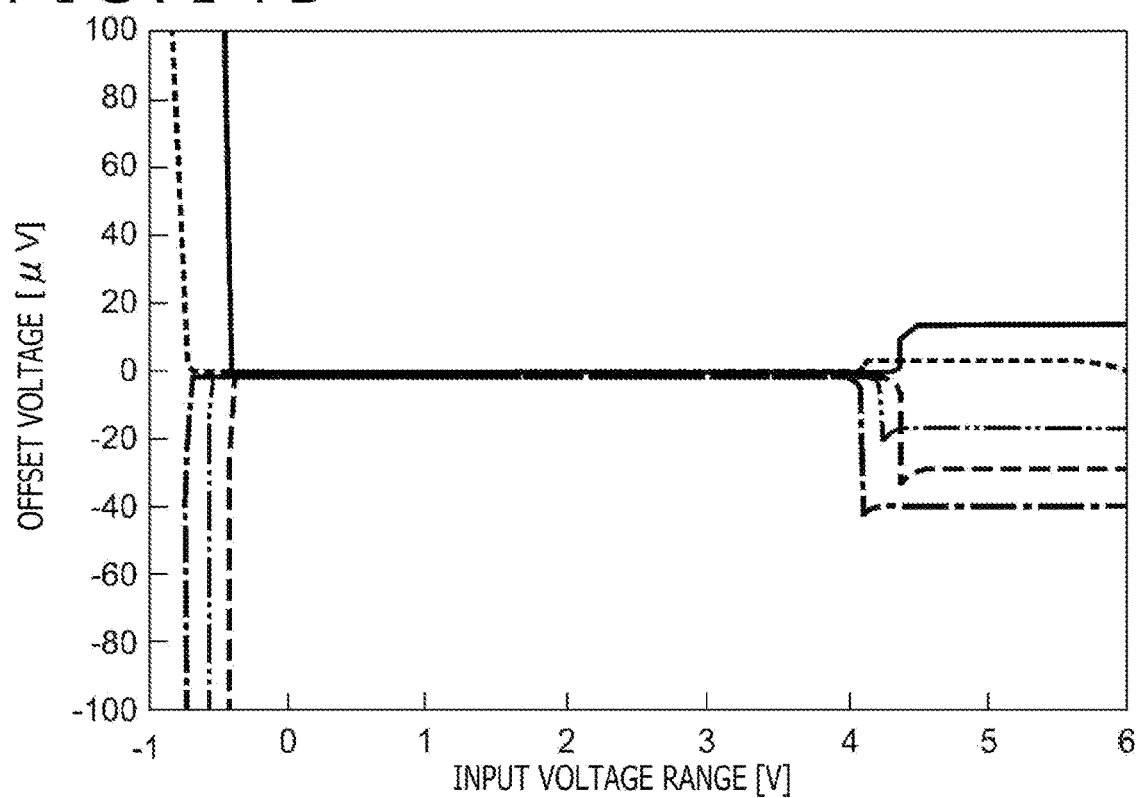
FIG. 14B is a diagram illustrating the offset voltage obtained using the comparative technique 1.

The configuration of the operational amplifier 1B is as described above. FIG. 14A is a diagram illustrating the offset voltage $V_{OFS}$ (simulation result) of a buffer including the operational amplifier 1B of FIG. 12. For comparison, the offset voltage obtained using the comparative technique 1 is illustrated in FIG. 14B again (the same figure as FIG. 7).

As can be understood from FIG. 14A, according to the second embodiment, the offset voltage can be reduced over a wide voltage range. Moreover, a peak and a dip of the offset voltage generated in the transition region can be suppressed.

While the embodiments of the present disclosure have been described using specific terms, these embodiments have been presented only to describe some principles and applications of the present disclosure. These embodiments are for illustrative purposes only and various other modifications and arrangement changes can be made without departing from the spirit and scope of the present disclosure defined in appended claims.

What is claimed is:
1. An operational amplifier comprising:
a non-inverting input terminal that receives a first input voltage;
an inverting input terminal that receives a second input voltage;
a P-type metal oxide semiconductor input differential pair connected to the non-inverting input terminal and the inverting input terminal;

a first input tail current source connected to sources of the P-type metal oxide semiconductor input differential pair;

an N-type metal oxide semiconductor input differential pair connected to the non-inverting input terminal and the inverting input terminal;

a second input tail current source connected to sources of the N-type metal oxide semiconductor input differential pair;

an output stage that receives an output of the P-type metal oxide semiconductor input differential pair and an output of the N-type metal oxide semiconductor input differential pair;

a first correction circuit that corrects an offset voltage of the P-type metal oxide semiconductor input differential pair; and a second correction circuit that corrects an offset voltage of the N-type metal oxide semiconductor input differential pair, wherein the first correction circuit and the second correction circuit operate over an operation region of the P-type metal oxide semiconductor input differential pair, an operation region of the N-type metal oxide semiconductor input differential pair, and a transition region in which both the P-type metal oxide semiconductor input differential pair and the N-type metal oxide semiconductor input differential pair operate.

2. The operational amplifier according to claim 1, wherein the first correction circuit includes a first correction differential amplifier including a P-type metal oxide semiconductor correction differential pair connected to the non-inverting input terminal and the inverting input terminal, and a first gm amplifier that converts an output signal of the first correction differential amplifier into a current signal and supplies the current signal to the output stage, and the second correction circuit includes a second correction differential amplifier including an N-type metal oxide semiconductor correction differential pair connected to the non-inverting input terminal and the inverting input terminal, and a second gm amplifier that converts an output signal of the second correction differential amplifier into a current signal and supplies the current signal to the output stage.

3. The operational amplifier according to claim 2, wherein the first correction differential amplifier further includes a first correction tail current source connected to sources of the P-type metal oxide semiconductor correction differential pair, and a first load circuit and a first correction current source each connected to drains of the P-type metal oxide semiconductor correction differential pair, and the second correction differential amplifier further includes a second correction tail current source connected to sources of the N-type metal oxide semiconductor correction differential pair, and a second load circuit and a second correction current source each connected to drains of the N-type metal oxide semiconductor correction differential pair.

4. The operational amplifier according to claim 1, wherein the output stage includes a first constant current circuit that mirrors a differential current of the P-type metal oxide semiconductor input differential pair and a differential current of the first correction circuit, a first gate-grounded circuit disposed on a path of the differential currents mirrored by the first constant current circuit, a second constant current circuit that mirrors a differential current of the N-type metal oxide semiconductor input differential pair and a differential current of the second correction circuit, and a second gate-grounded circuit disposed on a path of the differential currents mirrored by the second constant current circuit.

5. The operational amplifier according to claim 1, wherein a current of the first input tail current source decreases as the first input voltage and the second input voltage increase, and a current of the second input tail current source changes in a complementary manner to the current of the first input tail current source.

6. The operational amplifier according to claim 2, wherein a current of the first input tail current source decreases as the first input voltage and the second input voltage increase, and a current of the second input tail current source and a current of the second gm amplifier change in a complementary manner to the current of the first input tail current source.

7. The operational amplifier according to claim 6, wherein the first gm amplifier includes a P-type metal oxide semiconductor differential pair, a current source disposed on a source side of the P-type metal oxide semiconductor differential pair, and a stop circuit disposed between the P-type metal oxide semiconductor differential pair and the current source and configured to switch to an interruption state when a current that flows through the P-type metal oxide semiconductor input differential pair becomes zero.

8. The operational amplifier according to claim 7, wherein the stop circuit includes two P-type metal oxide semiconductor transistors disposed such that sources of the P-type metal oxide semiconductor transistors are connected to each other, and one of gates of the P-type metal oxide semiconductor transistors is connected to the inverting input terminal and another one of the gates is connected to the non-inverting input terminal.

9. The operational amplifier according to claim 7, wherein the first gm amplifier further includes a variable current source that sinks, from a connection node between the current source and the stop circuit, a current that changes in a complementary manner to the current of the first input tail current source.

* * * * *